United States Patent
Kim et al.

(10) Patent No.: US 8,836,370 B2
(45) Date of Patent: Sep. 16, 2014

(54) SEMICONDUCTOR APPARATUS

(75) Inventors: Ki Han Kim, Icheon-si (KR); Hyun Woo Lee, Icheon-si (KR); Dae Han Kwon, Icheon-si (KR); Chul Woo Kim, Seoul (KR); Soo Bin Lim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 35 days.

(21) Appl. No.: 13/611,298

(22) Filed: Sep. 12, 2012

(65) Prior Publication Data

US 2013/0135038 A1    May 30, 2013

(30) Foreign Application Priority Data

Nov. 29, 2011 (KR) .......................... 10-2011-0126141

(51) Int. Cl.
*H03K 19/0175* (2006.01)

(52) U.S. Cl.
USPC ............................................. 326/63; 327/333

(58) Field of Classification Search
CPC .............. H03K 19/018521; H03K 19/017509; H03K 19/0016; G06F 1/3212; G06F 1/3206; G11C 7/1057
See application file for complete search history.

(56) References Cited

U.S. PATENT DOCUMENTS

| | | | | |
|---|---|---|---|---|
| 5,151,620 A | * | 9/1992 | Lin | 326/71 |
| 6,124,749 A | * | 9/2000 | Morishima | 327/390 |
| 6,512,715 B2 | * | 1/2003 | Okamoto et al. | 365/227 |
| 6,714,047 B2 | * | 3/2004 | Shimizu et al. | 326/62 |
| 6,946,901 B2 | * | 9/2005 | Kang et al. | 327/544 |
| 7,414,442 B2 | * | 8/2008 | Uno | 327/112 |
| 7,800,407 B1 | * | 9/2010 | Agarwal et al. | 326/80 |
| 7,825,720 B2 | * | 11/2010 | Ramaraju et al. | 327/543 |
| 7,855,574 B2 | * | 12/2010 | Santurkar et al. | 326/68 |
| 8,451,050 B2 | * | 5/2013 | Yamaoka et al. | 327/538 |
| 2007/0069807 A1 | * | 3/2007 | Ho | 327/541 |
| 2012/0200345 A1 | * | 8/2012 | Kim | 327/543 |
| 2012/0287712 A1 | * | 11/2012 | Murakami | 365/185.05 |

FOREIGN PATENT DOCUMENTS

KR    10-2007-0115792 A    12/2007
KR    10-2008-0066703 A    7/2008

* cited by examiner

*Primary Examiner* — Thomas J Hiltunen
(74) *Attorney, Agent, or Firm* — William Park & Associates Patent Ltd.

(57) ABSTRACT

A semiconductor apparatus includes a power supply changing unit. The power supply changing unit is configured to receive an enable signal and power supply voltage, generate first voltage or second voltage according to the enable signal, change a voltage level of the second voltage according to a level signal, and supply the first voltage or the second voltage as a driving voltage of an internal circuit, wherein the internal circuit receives a first input signal to output a second input signal.

37 Claims, 3 Drawing Sheets

SEMICONDUCTOR APPARATUS

CROSS-REFERENCES TO RELATED APPLICATION

The present application claims priority under 35 U.S.C. §119(a) to Korean application number 10-2011-0126141, filed on Nov. 29, 2011, in the Korean Intellectual Property Office, which is incorporated herein by reference in its entirety as set forth in full.

BACKGROUND

1. Technical Field

Example embodiments of the present invention relate to a semiconductor apparatus, and more particularly, to a power supply circuit for a semiconductor apparatus.

2. Related Art

Generally, a semiconductor apparatus is supplied with a voltage from the outside to operate an internal circuit. However, even when reducing power consumption of a semiconductor apparatus, the semiconductor apparatus can stably operate the internal circuit, while the semiconductor apparatus is supplied with a same supply voltage even in a mode (for example, a power down mode) in which the semiconductor apparatus is not operated or a case in which the semiconductor apparatus consumes low power (for example, when the semiconductor apparatus is operated at a low frequency) to operate the internal circuit and as a result, unnecessary current consumption and leakage current occur.

Therefore, when the semiconductor apparatus consumes low power, a need exists for a power supply circuit capable of preventing current consumption and leakage current from occurring by changing voltage when the semiconductor apparatus consumes low power.

SUMMARY

In one embodiment of the present invention, a semiconductor apparatus, includes: a power supply changing unit configured to receive an enable signal and power supply voltage, generate first voltage or second voltage according to the enable signal, change a voltage level of the second voltage according to a level signal, and supply the first voltage or the second voltage as driving voltage of an internal circuit, wherein the internal circuit receives a first input signal to output a second input signal.

In another embodiment of the present invention, a semiconductor apparatus includes: a power supply changing unit configured to change power supply voltage in response to an enable signal or a level signal to generate a same first voltage as the power supply voltage or second voltage having a voltage level lower than the power supply voltage and supply the first voltage or the second voltage as driving voltage of an internal circuit, wherein the internal circuit receives a first input signal to output a second input signal and swing the first input signal between the first voltage and ground voltage or between the second voltage and the ground voltage in the internal circuit.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to an embodiment of the present invention will be described below with reference to the accompanying drawings through example embodiments.

Figure 1:
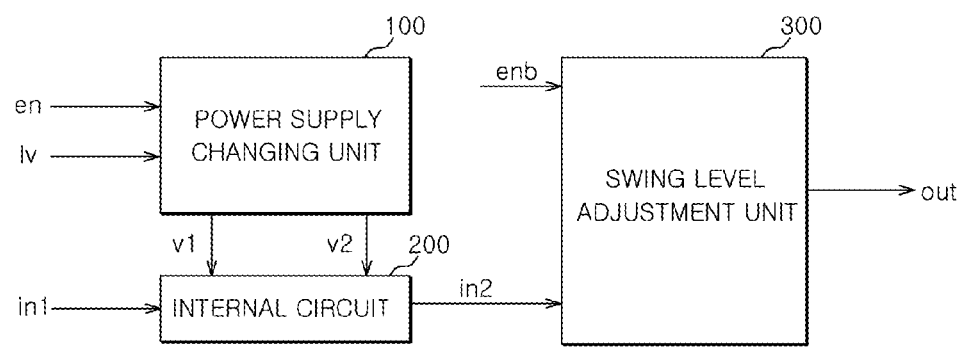
FIG. 1 is a schematic block diagram of a power supply circuit in accordance with an embodiment of the present invention.

FIG. 1 is a schematic block diagram of a power supply circuit in accordance with an embodiment of the present invention.

Referring to FIG. 1, a power supply circuit in accordance with embodiments of the present invention can be configured to include a power supply changing unit 100 and a swing level adjustment unit 300.

An operation of a power supply circuit will be described with reference to FIG. 1. The power supply changing unit 100 receives an enable signal en and a level signal lv to generate first voltage v1 and second voltage v2 and an enable bar signal enb that inverts the enable signal en.

An internal circuit 200 is supplied with the first voltage v1 or the second voltage v2 as driving voltage of the internal circuit 200. The internal circuit 200 receives a first input signal in1 to generate a second input signal in2.

The swing level adjustment unit 300 receives the enable signal en and the enable bar signal enb to adjust a swing level of the second input signal in2, thereby generating an output signal out.

In an apparatus for determining a power mode, the enable signal en is output as a high level when determining a general voltage mode and the enable signal en is output as a low level at the time of determining a low voltage mode which is relatively lower than the general voltage mode. The enable signal en may be a command signal such as an active signal act used in the semiconductor apparatus.

The general semiconductor apparatus has a power down mode for stopping an operation of peripheral circuits so as to reduce unnecessary power consumption consumed in a standby state. The power down mode may be a low voltage mode according to embodiments of the present invention.

When the low voltage mode is selected by the enable signal en, the level signal lv is a signal determining a voltage level in the low voltage mode.

The level signal lv, which is a signal determining the voltage level, may be determined and output in, for example, a time to digital converter (TDC) apparatus. The TDC apparatus is an apparatus generally used to measure a frequency of a signal.

Generally, the TDC apparatus receives a clock used in the semiconductor apparatus. The TDC apparatus generates a code value corresponding to the frequency of the input clock. When the code value is a predetermined frequency or more, the TDC apparatus determines that the signal is a high frequency. If the TDC apparatus determines that the signal is a high frequency, a logic level of the level signal lv is output as a low level. When the code value is a predetermined frequency or less, the TDC apparatus determines that the signal is a low frequency. If the TDC apparatus determines that the signal is a low frequency, the logic level of the level signal lv is output as a high level.

The TDC apparatus outputs the level signal lv even in the general voltage mode. However, the power supply changing unit 100 in accordance with an embodiment of the present invention does not generate a voltage of the low voltage mode depending on the level signal lv when the enable signal en is the high level; and generates the voltage of the low voltage mode depending on the level signal lv when the enable signal en is the low level.

For example, the enable signal en is output as the low level in the apparatus of determining the power mode. In this case, the power mode becomes the power down mode. The power down mode includes a self refresh mode. When the power down mode is the self refresh mode, the semiconductor apparatus is generally operated as an internal clock of a frequency lower than the internal clock used in the semiconductor. Generally, if the TDC apparatus determines that the code value is a predetermined frequency or less based on the internal clock used in the semiconductor apparatus, the TDC apparatus determines that the signal is the low frequency, such that the TDC apparatus outputs the logic level of the level signal lv as the high level.

For example, when the enable signal en is the low level, in an embodiment of the present invention the first voltage v1 is output by changing the voltage level according to the level signal lv.

The enable bar signal enb is a signal that inverts the logic level of the enable signal en.

More specifically, the power supply changing unit 100 generates the first voltage v1 when the enable signal en is input as the high level and supplies the generated first voltage V1 to the internal circuit 200. The power supply changing unit 100 changes the voltage according to the level signal lv when the enable signal is input as the low level and supplies the second voltage v2 to the internal circuit 200.

The second voltage v2 is lower than the first voltage v1.

The internal circuit 200 is supplied with the first voltage v1 or the second voltage v2 and uses the supplied first voltage v1 or the supplied second voltage v2 as the driving voltage thereof. The internal circuit 200 receives the first input signal in1 to output the second input signal in2 and uses the first voltage v1 or the second voltage v2 as the driving voltage.

The internal circuit 200 may be a circuit driven by using the power supply voltage within the semiconductor apparatus.

The swing level adjustment unit 300 is adjusted so that the second input signal in2 may be operated between ground voltage and power supply voltage Vdd and determines a swing width of the second input signal to output the output signal out.

Figure 2A:
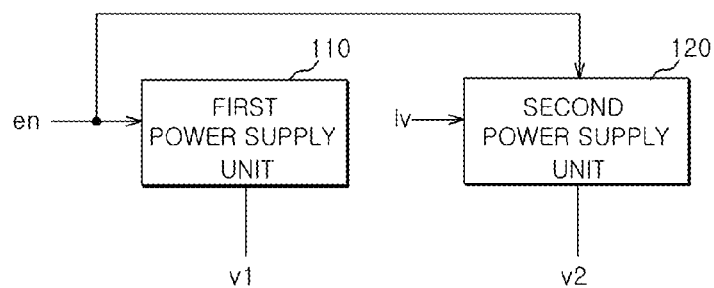
FIG. 2A is a schematic block diagram of a power supply changing unit in accordance with an embodiment of the present invention.

FIG. 2A is a schematic block diagram of the power supply changing unit 100 in accordance with an embodiment of the present invention.

Referring to FIG. 2A, the power supply changing unit 100 in accordance with an embodiment of the present invention can be configured to include a first power supply unit 110 and a second power supply unit 120.

The first power supply unit 110 receives the enable signal en to generate the first voltage v1. The second power supply unit 120 receives the enable signal en and the level signal lv to generate the second voltage v2 and the enable bar signal enb.

In detail, the first power supply unit 110 generates the first voltage v1 when the logic level of the enable signal en is the high level and does not generate the first voltage v1 when the logic level of the enable signal en is the low level.

The second power supply unit 120 generates the enable bar signal enb when the logic level of the enable signal en is the high level and does not generate the second voltage v2. The second power supply unit 120 generates the second voltage v2 according to the level signal lv when the logic level of the enable signal en is the low level and generated that enable bar signal enb.

More specifically, the second power supply unit 120 generates the voltage of the second voltage v2 lower by a predetermined voltage than the first voltage v1, when the logic level of the enable signal en is the low level and the logic level of the level signal lv is input as the low level. That is, if the first voltage v1 is set to be Vdd and the predetermined voltage is set to be Vtn, the second voltage V2 becomes Vdd−Vtn. In addition, the second power supply unit 120 generates the voltage of the second voltage v2 two times lower than the first voltage v1, when the logic level of the enable signal en is the low level and the logic level of the level signal lv is input as the high level. In this case, the second voltage V2 becomes Vdd−2*Vtn.

Figure 2B:
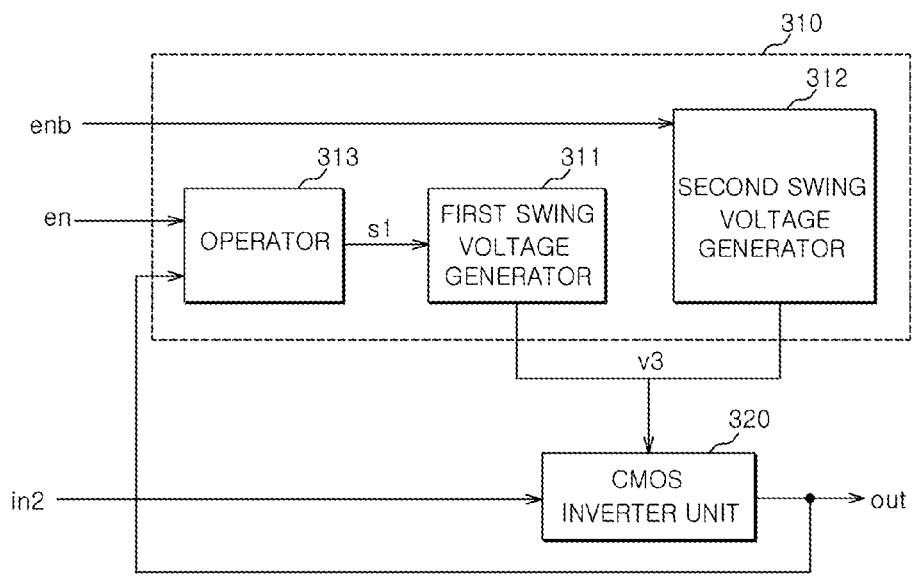
FIG. 2B is a schematic block diagram of a swing level adjustment unit in accordance with an embodiment of the present invention.

FIG. 2B is a schematic block diagram of a swing level adjustment unit 300 in accordance with an embodiment of the present invention.

Referring to FIG. 2B, the swing level adjustment unit 300 in accordance with an embodiment of the present invention includes a swing voltage generator 310 and a CMOS inverter unit 320.

The swing voltage generator 310 can be configured to include a firs swing voltage generator 311, a second swing voltage generator 312, and an operator 313.

The CMOS inverter unit 320 receives the second input signal in2 that is generated from the internal circuit 200 to invert the second input signal in2, thereby outputting an output signal out.

The operator 313 receives the enable signal en and the output signal out and logically operates the received enable signal en and output signal out to generate a switching signal s1.

The first swing voltage generator 311 generates third voltage V3 according to the switching signal s1.

The second swing voltage generator 312 generates third voltage V3 according to the enable bar enb.

Therefore, the third voltage v3 is the voltage generated from the first swing voltage generator 311 or the second swing voltage generator 312.

The CMOS inverter unit 320 uses the third voltage V3 as the driving voltage to adjust the swing level of the second input signal in2.

Figure 3:
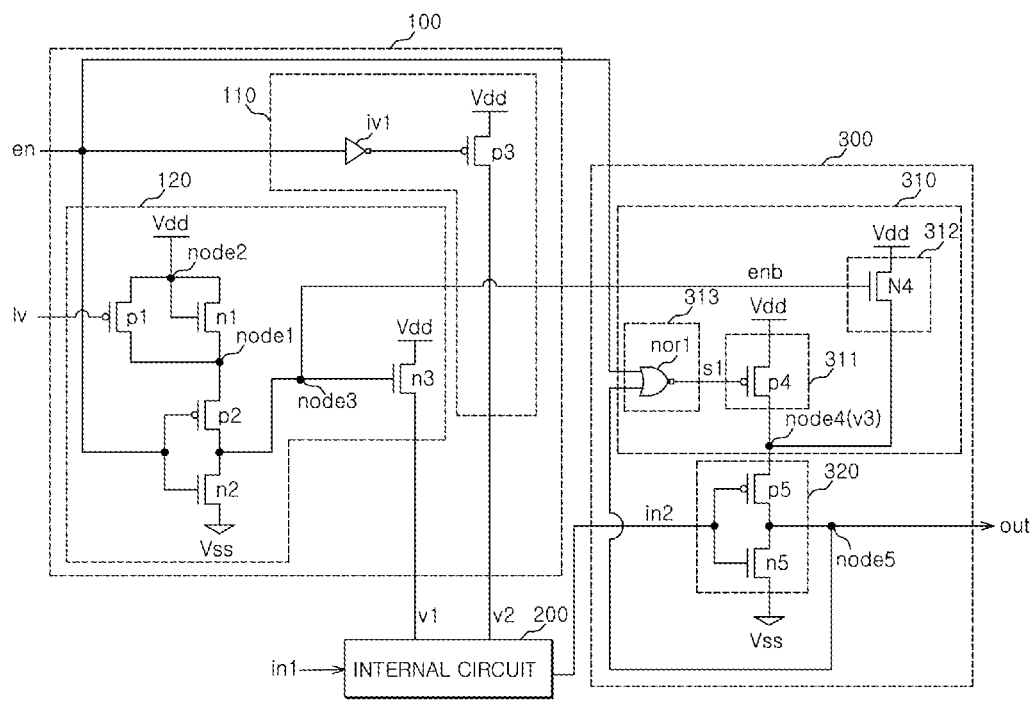
FIG. 3 is a detailed circuit diagram of a power supply circuit in accordance with an embodiment of the present invention.

FIG. 3 is a detailed circuit diagram of a power supply circuit in accordance with an embodiment of the present invention.

Referring to FIG. 3, a power supply circuit in accordance with an embodiment of the present invention can be configured to include the power supply changing unit 100 and the swing level adjustment unit 300.

The power supply changing unit 100 includes a first power supply unit 110 and a second power supply unit 120. In detail, the power supply changing unit 100 can be configured to include first to third PMOS transistors p1, p2, and p3, first to third NMOS transistors n1, n2, and n3, and a first inverter iv1.

An internal circuit 200 is supplied with the first voltage v1 or the second voltage v2 from the power supply changing unit 100 as the driving voltage. The internal circuit 200 receives the first input signal in1 to generate the second input signal in2.

In detail, the swing level adjustment unit 300 includes fourth to fifth PMOS transistors p4 and p5, fourth to fifth NMOS transistors n4 and n5, and a first NOR gate nor 1.

The threshold voltage (hereinafter, "Vtn") of the first to fifth NMOS transistors n1, n2, n3, n4, and n5 are the same.

The first power supply 110 includes a first inverter iv1 and a third PMOS transistor p3. The first power supply unit 110 inputs the enable signal en to the first inverter iv1. The first inverter iv1 inverts the enable signal en and inputs the inverted enable signal en to a gate of the third PMOS transistor p3. The gate of the third PMOS transistor p3 receives the inverted enable signal en and the source thereof is supplied with the voltage Vdd, such that a drain of the third PMOS transistor p3 generates the second voltage V2. Therefore, the first voltage V1 has the same voltage level as the input power supply voltage Vdd when the a of the third PMOS transistor p3 is turned-on. When the enable signal en input to the first power supply unit 110 is the low level, the logic level of the enable signal en is inverted in the first inverter iv1 and the enable signal en is input to the gate of the third PMOS transistor p3 as the high level, such that the third PMOS transistor p3 is not operated. When the enable signal en input to the first power supply unit 110 is the high level, the logic level of the enable signal en is inverted in the first inverter iv1 and the enable signal en is input to the gate of the third PMOS transistor p3 as the low level, such that the drain of the third PMOS transistor p3 generates the first voltage v1.

The second power supply unit 120 includes the first to second PMOS transistors p1 and p2 and the first to third NMOS transistors n1, n2, and n3. The gate of the first PMOS transistor p1 is supplied with the level signal lv. A source of the first PMOS transistor p1 is connected with a second node node2 and the drain of the first PMOS transistor p1 is connected with a first node node1. The gate and drain of the first NMOS transistor n1 are connected with the second node node2 and a source of the first NMOS transistor n1 is connected with the first node 1. Therefore, the second node node2 is connected with the source of the first PMOS transistor p1 and the gate and drain of the first NMOS transistor n1. The second node node2 is supplied with the power supply voltage Vdd.

The gate of the second PMOS transistor p2 is supplied with the gate enable signal en. A source of the second PMOS transistor is connected with the first node node1 and the drain thereof is connected with the third node node3. The gate of the second NMOS transistor n2 is supplied with the gate enable signal en. The drain of the second NMOS transistor n2 is connected with the third node node3 and a source of the second NMOS transistor is connected with the ground voltage source Vss. Therefore, the second PMOS transistor p2 and the second NMOS transistor n2 are input with the enable signal en and output the inverted enable signal en to the third node node 3, wherein the inverted enable signal en is the enable bar signal enb. Therefore, the drain of the first PMOS transistor p1 and the source of the first NMOS transistor n1 are connected with the first node node1.

The gate of the third NMOS transistor n3 is connected with the third node and the drain thereof is supplied with the power supply voltage Vdd, such that a source of the third NMOS transistor n3 generates the second voltage v2.

First, when the gate of the first PMOS transistor p1 is supplied with the level signal lv of the low level, the first PMOS transistor p1 is driven. In this case, the gate and drain of the first NMOS transistor n1 are supplied with the power supply voltage Vdd, such that the voltage generated from the source of the first NMOS transistor n1 is blocked and the first node node1 generates the voltage supplied from the drain of the first PMOS transistor p1. Therefore, the voltage of the first node node 1 is the same as the power supply voltage Vdd.

When the enable signal en is input to the second power supply unit 120 as the low level, the gate of the second PMOS transistor p2 is driven by being supplied with the enable signal en and the second NMOS transistor n2 is not driven. Therefore, the same voltage as the first node node1 is output to the third node node3. Therefore, the voltage of the third node node 3 is the same as the power supply voltage Vdd.

The gate of the third NMOS transistor n3 is connected with the third node node3 and the drain thereof is supplied with the power supply voltage Vdd, such that the source of the third NMOS transistor n3 outputs the second voltage V2.

In this case, since the voltage of the third node node3 is the power supply voltage Vdd, the second voltage v2 output from the source of the third NMOS transistor n3 is reduced by a threshold voltage value Vtn of the third NMOS transistor n3 from the voltage supply voltage Vdd and is then output. That is, the value of the second voltage v2 becomes power supply voltage Vdd−threshold voltage Vtn.

However, when the enable signal en is input to the second power supply unit 120 as the high level, the second PMOS transistor p2 is not driven and only the second NMOS transistor n2 is driven, so that the enable bar signal enb of the low level is output to the third node node3. Therefore, in this case, the second voltage V2 is not output.

Next, when the gate of the first PMOS transistor p1 is supplied with the level signal lv of the high level, the first PMOS transistor p1 is not driven. In this case, the gate and drain of the first NMOS transistor n1 are supplied with the power supply voltage Vdd, such that the voltage generated from the source of the first NMOS transistor n1 is supplied to the first node node 1. Therefore, the voltage of the first node node1 is reduced by the threshold voltage value Vtn of the first NMOS transistor n1 from the power supply voltage Vdd and is then output. That is, the voltage of the first node node1 becomes power supply voltage Vdd−threshold voltage Vtn.

When the enable signal en is input to the second power supply unit 120 as the low level, the gate of the second PMOS transistor p2 is driven by being supplied with the enable signal en and the second NMOS transistor n2 is not driven. Therefore, the same voltage as the first node node1 is output to the third node node3. The voltage of the third node node3 is reduced by the threshold voltage value Vtn of the first NMOS transistor n1 from the power supply voltage Vdd and is then output. That is, the voltage of the third node node3 becomes power supply voltage Vdd−threshold voltage Vtn.

The gate of the third NMOS transistor n3 is connected with the third node node3 and the drain thereof is supplied with the power supply voltage Vdd, such that the source of the third NMOS transistor n3 outputs the second voltage V2.

In this case, since the voltage of the third node node3 is the power supply voltage Vdd−threshold voltage Vtn, the second voltage v2 output from the source of the third NMOS transistor n3 is reduced by a threshold voltage value Vtn of the third NMOS transistor n3 from the voltage supply voltage Vdd−threshold voltage Vtn and is then output. That is, the value of the second voltage v2 becomes power supply voltage Vdd−2*threshold voltage 2*Vtn.

However, when the enable signal en is input to the second power supply unit 120 as the high level, the second PMOS transistor p2 is not driven and only the second NMOS transistor n2 is driven, so that the enable bar signal enb of the low level is output to the third node node3. Therefore, in this case, the second voltage V2 is not output.

An internal circuit 200 is supplied with the first voltage v1 or the second voltage v2 from the power supply changing unit 100 as the driving voltage. The internal circuit 200 receives the first input signal in1 to generate the second input signal in2.

The swing level adjustment unit 300 includes the swing voltage generator 310 and the CMOS inverter unit 320.

The swing voltage generator 310 can be configured to include the first swing voltage generator 311, the second swing voltage generator 312, and the operator 313.

In detail, the swing level adjustment unit 300 includes fourth to fifth PMOS transistors p4 and p5, fourth to fifth NMOS transistors n4 and n5, and a first NOR gate nor 1.

The first swing voltage generator 311 includes a fourth PMOS transistor p4. The gate of the fourth PMOS transistor p4 is supplied with the switching signal s1 output from the operator 313, the drain thereof is connected with the fourth node node4, and the source thereof is supplied with the power supply voltage Vdd.

The third voltage v3 is the same as the voltage of the fourth node node4.

The second swing voltage generator 312 includes the fourth PMOS transistor n4. The gate of the fourth NMOS transistor n4 is connected with the third node node 3, the source thereof is connected with the fourth node node4, and the drain thereof is supplied with the power supply voltage Vdd.

The CMOS inverter unit 320 includes the fifth PMOS transistor p5 and the fifth NMOS transistor.

The gate of the fifth PMOS transistor p5 is supplied with the second input signal in2, the source thereof is connected with the fourth node node4, and the drain thereof is connected with the fifth node node5.

The gate of the fifth NMOS transistor n5 is supplied with the second input signal in2, the drain thereof is connected with the fourth node node4, and the source thereof is connected with the ground voltage source.

That is, the fifth PMOS transistor p5 and the fifth NMOS transistor n5 are supplied with the second input signal in2 and inverts the second input signal in2 and then, outputs the inverted second input signal in2 to the fifth node node5.

The operator 313 logically operates the output signal out output from the fifth node node5 and the enable signal en to generate the switching signal s1. The switching signal s1 is input to the gate of the fourth PMOS transistor p4.

The operator 313 is configured by the first NOR gate nor1.

The operation of the swing level adjustment unit 300 will be described with reference to FIG. 3.

First, the operation of the swing level adjustment unit 300 will be described when the logic level of the enable signal en is the high level.

When the logic level of the enable signal en is the high level, the signal output from the third node node3 is the enable bar signal enb, such that the logic level of the enable bar signal enb is the low level.

The gate of the fourth NMOS transistor n4 is connected with the third node node3 and is thus supplied with the enable bar signal enb of the low level, such that the fourth NMOS transistor n4 is not driven.

When the operator 313 is supplied with the enable signal en of the high level, the operator 313 outputs the signal of the low level regardless of the logic level of the output signal out of the fifth node node5.

The signal of the fifth node node5 becomes the output signal out.

The fourth PMOS transistor p4 is supplied with the logic signal of the low level and is then driven to generate the voltage at the fourth node node4. In this case, the voltage generated at the fourth node node4 is the same as the power supply voltage Vdd that is the voltage supplied to the source of the fourth PMOS transistor p4. That is, the voltage of the fourth node node4 is the same as the power supply voltage Vdd.

Next, the case in which the logic level of the enable signal en is the low level and the logic level of the second input signal in2 is the high level will be described.

When the logic level of the second input signal in2 is the high level, the fifth PMOS transistor p5 of the CMOS inverter unit 320 is not turned-on and only the fifth NMOS transistor n5 is turned-on. Therefore, when the logic level of the second input signal in2 is the high level, the output of the fifth node node5 outputs the signal of the low level having the level of the ground voltage Vss regardless of the voltage of the fourth node node4.

Next, the case in which the logic level of the enable signal en is the low level and the logic level of the second input signal in2 is the low level will be described.

When the logic level of the enable signal en is the low level, the logic level of the enable bar signal enb output from the third node node3 is the high level.

The second input signal in2 is input to the fifth PMOS transistor p5 and the fifth NMOS transistor n5 and thus, the inverted signal is output to the fifth node node5. In this case, when the second input signal in2 is the low level, the output signal out of the fifth node node5 is the high level.

When the operator 313 is supplied with the enable signal en of the low level and the output signal out of the fifth node node5 of the high level, the operator 313 outputs the switching signal s1 of the low level. Therefore, the fourth PMOS transistor p4 is supplied with the switching signal s1 of the low level to generate the voltage at the fourth node node4. In this case, the voltage generated at the fourth node node4 is the same as the power supply voltage Vdd that is the voltage supplied to the source of the fourth PMOS transistor p4. That is, the voltage of the fourth node node4 is the same as the power supply voltage Vdd.

However, the gate of the fourth NMOS transistor n4 is connected with the third node node3 and is thus supplied with the enable signal enb of the high level but the voltage of the fourth node n4 connected with the source of the fourth NMOS transistor n4 is the power supply voltage Vdd and thus, does not exceed the threshold voltage Vtn of the fourth NMOS transistor n4, such that the fourth NMOS transistor n4 is not turned-on.

In other words, the swing level adjustment unit 300 swings the second input signal in2 between the power supply voltage Vdd and the ground voltage Vss when the logic level of the enable signal en is the high level.

In addition, the swing level adjustment unit 300 outputs the output signal out of the level of the ground voltage Vss regardless of the voltage of the fourth node n4 when the logic level of the enable signal en is the low level and the second input signal in2 is the high level.

Next, the swing level adjustment unit 300 outputs the output signal out of the high level having the level of the power supply voltage Vdd when the logic level of the enable signal en is the low level and the second input signal in2 is the low level.

Generally, the swing level adjustment 300 receives the second input signal in2 to output the signal swung between the power supply voltage Vdd and the ground voltage Vss.

While certain embodiments have been described above, it will be understood to those skilled in the art that embodiments described are by way of example only. Accordingly, the apparatus described herein should not be limited based on the described embodiments. Rather, the apparatus described herein should only be understood in light of the claims that follow when taken in conjunction with the above description and accompanying drawings.

What is claimed is:

1. A semiconductor apparatus, comprising:
a power supply changing unit configured to receive an enable signal and power supply voltage, generate first voltage or second voltage according to the enable signal, change a voltage level of the second voltage according to a level signal, and supply the first voltage or the second voltage as a driving voltage of an internal circuit, wherein the internal circuit receives a first input signal to output a second input signal; and
a swing level adjustment unit configured to adjust a swing level of the second input signal according to the enable signal to output an output signal.

2. The semiconductor apparatus of claim 1, wherein the second voltage has a voltage level lower than the first voltage.

3. The semiconductor apparatus of claim 1, wherein the power supply changing unit includes:
a first power supply unit configured to receive the power supply voltage and generate the first voltage according to the enable signal; and
a second power supply unit configured to receive the power supply voltage and generate the second voltage according to the enable signal and the level signal.

4. The semiconductor apparatus of claim 3, wherein the second voltage has a voltage level lower than the first voltage.

5. The semiconductor apparatus of claim 3, wherein the first power supply unit generates the first voltage according to the enable signal.

6. The semiconductor apparatus of claim 5, wherein the first power supply unit generates the first voltage having the same voltage level as the power supply voltage.

7. The semiconductor apparatus of claim 3, wherein the second power supply unit generates the second voltage according to the enable signal.

8. The semiconductor apparatus of claim 7, wherein the second power supply unit generates voltage reduced by a predetermined voltage from the power supply voltage when the logic level of the level signal is a low level.

9. The semiconductor apparatus of claim 8, wherein the predetermined voltage is threshold voltage of an NMOS transistor.

10. The semiconductor apparatus of claim 8, wherein the second power supply unit generates voltage reduced by predetermined voltage from the power supply voltage according to the level signal.

11. The semiconductor apparatus of claim 10, wherein the predetermined voltage is two times larger than the threshold voltage of the NMOS transistor.

12. The semiconductor apparatus of claim 1, wherein the swing level adjustment unit includes:
a CMOS inverter unit configured to invert the second input signal to generate an output signal; and
a swing voltage generator configured to receive the power supply voltage and supply third voltage as driving voltage of the CMOS inverter unit according to the enable signal and the output signal.

13. The semiconductor apparatus of claim 12, wherein the swing voltage generator includes:
an operator configured to logically operate the enable signal and the output signal to generate a switching signal;
a first swing voltage generator configured to generate the third voltage according to the switching signal; and
a second swing voltage generator configured to generate the third voltage according to an enable bar signal inverting the enable signal.

14. The semiconductor apparatus of claim 13, wherein the swing voltage generator generates the same third voltage as the power supply voltage according to the enable signal.

15. The semiconductor apparatus of claim 13, wherein the operator generates the switching signal of the low level regardless of the logic level of the output signal according to the enable signal.

16. The semiconductor apparatus of claim 13, wherein the first swing voltage generator generates the same third voltage as the power supply voltage according to the switching signal.

17. The semiconductor apparatus of claim 13, wherein the swing voltage generator is the same third voltage as the second voltage according to the enable signal and the second input signal.

18. The semiconductor apparatus of claim 13, wherein the swing voltage generator generates the same third voltage as the power supply voltage according to the enable signal and the second input signal.

19. The semiconductor apparatus of claim 13, wherein the second swing voltage generator generates the same third voltage as the power supply voltage according to the enable bar signal the second input signal.

20. The semiconductor apparatus of claim 1, wherein the swing level adjustment unit is adjusted so that a swing level of the second input signal is between the power supply voltage and ground voltage according to the enable signal.

21. The semiconductor apparatus of claim 1, wherein the swing level adjustment unit logically operates the enable signal and the second input signal and determines the swing level of the second input signal according to the enable signal.

22. The semiconductor apparatus of claim 1, wherein the swing level adjustment unit determines the swing level of the second input signal according to a logic level of the second input signal responsed to the enable signal.

23. A semiconductor apparatus, comprising:
a power supply changing unit configured to change power supply voltage in response to an enable signal or a level signal to generate a same first voltage as the power supply voltage or second voltage having a voltage level lower than the power supply voltage and supply the first voltage or the second voltage as driving voltage of an internal circuit, wherein the internal circuit receives a first input signal to output a second input signal and swing the first input signal between the first voltage and ground voltage or between the second voltage and the ground voltage in the internal circuit; and
a swing level adjustment unit to receive the second input signal and output a signal swung between the power supply voltage and the ground voltage in response to the enable signal.

24. The semiconductor apparatus of claim 23, wherein the power supply changing unit includes:
a first power supply unit configured to receive the power supply voltage and generate the first voltage according to the enable signal; and
a second power supply unit configured to receive the power supply voltage and generate the second voltage according to the enable signal and the level signal.

25. The semiconductor apparatus of claim 24, wherein the first power supply unit generates the first voltage when the logic level of the enable signal is a high level.

26. The semiconductor apparatus of claim 24, wherein the second power supply unit generates the second voltage when the logic level of the enable signal is a low level.

27. The semiconductor apparatus of claim 26, wherein the second power supply unit generates voltage reduced by predetermined voltage from the power supply voltage when the logic level of the level signal is a low level.

28. The semiconductor apparatus of claim 27, wherein the predetermined voltage is threshold voltage of an NMOS transistor.

29. The semiconductor apparatus of claim 27, wherein the second power supply unit generates voltage reduced by predetermined voltage from the power supply voltage when the logic level of the level signal is a high level.

30. The semiconductor apparatus of claim 29, wherein the predetermined voltage is two times larger than the threshold voltage of the NMOS transistor.

31. The semiconductor apparatus of claim 23, wherein the swing level adjustment unit includes:
   a CMOS inverter unit configured to invert the second input signal to generate an output signal; and
   a swing voltage generator configured to receive the power supply voltage and supply third voltage as driving voltage of the CMOS inverter unit according to the enable signal and the output signal.

32. The semiconductor apparatus of claim 31, wherein the swing voltage generator includes:
   an operator configured to logically operate the enable signal and the output signal to generate a switching signal;
   a first swing voltage generator configured to generate the third voltage according to the switching signal; and
   a second swing voltage generator configured to generate the third voltage according to an enable bar signal inverting the enable signal.

33. The semiconductor apparatus of claim 32, wherein the operator is a NOR gate.

34. The semiconductor apparatus of claim 31, wherein the swing voltage generator generates the same third voltage as the power supply voltage when the logic level of the enable signal is the high level.

35. The semiconductor apparatus of claim 31, wherein the swing voltage generator generates the same third voltage as the power supply voltage when the logic level of the enable signal is the low level and the logic level of the second input signal is the low level.

36. The semiconductor apparatus of claim 31, wherein the swing voltage generator is the same third voltage as the second voltage when the logic level of the enable signal is the low level and the logic level of the second input signal is the high level.

37. The semiconductor apparatus of claim 36, wherein in the output signal, the logic level is the logic level and the voltage level is the ground voltage level.

* * * * *